(12) United States Patent
Sakai

(10) Patent No.: US 10,938,363 B2
(45) Date of Patent: Mar. 2, 2021

(54) AUDIO CIRCUIT

(71) Applicant: ROHM CO., LTD., Kyoto (JP)

(72) Inventor: Mitsuteru Sakai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 106 days.

(21) Appl. No.: 16/176,452

(22) Filed: Oct. 31, 2018

(65) Prior Publication Data

US 2019/0131947 A1  May 2, 2019

(30) Foreign Application Priority Data

Nov. 2, 2017 (JP) .............................. JP2017-213088

(51) Int. Cl.
*H03G 3/30* (2006.01)
*H04R 3/00* (2006.01)

(52) U.S. Cl.
CPC ..... *H03G 3/3005* (2013.01); *H03G 2201/508* (2013.01); *H04R 3/00* (2013.01); *H04R 2499/11* (2013.01); *H04R 2499/13* (2013.01); *H04R 2499/15* (2013.01)

(58) Field of Classification Search
CPC .... H03G 11/08; H03G 2201/508; H04R 3/00; H04R 2499/11; H04R 2499/13
See application file for complete search history.

(56) References Cited

U.S. PATENT DOCUMENTS

| | | | | |
|---|---|---|---|---|
| 3,934,085 A | * | 1/1976 | Munson | H03G 3/32 381/57 |
| 6,819,768 B1 | * | 11/2004 | Sculley | H03G 3/348 330/284 |
| 2006/0244549 A1 | * | 11/2006 | Takahata | H03G 1/0088 333/81 R |
| 2012/0328126 A1 | * | 12/2012 | Sakai | H03G 3/3005 381/107 |

FOREIGN PATENT DOCUMENTS

| | | |
|---|---|---|
| JP | 2007325057 A | 12/2007 |
| JP | 2008035113 A | 2/2008 |
| JP | 2009027412 A | 2/2009 |
| JP | 2009200730 A | 9/2009 |

* cited by examiner

*Primary Examiner* — Davetta W Goins
*Assistant Examiner* — Daniel R Sellers
(74) *Attorney, Agent, or Firm* — Cantor Colburn LLP

(57) ABSTRACT

A D/A converter coverts a digital audio signal into an analog audio signal. An analog volume circuit receives an output of the D/A converter. A controller controls the analog volume circuit. The controller shortens transition time at each step in the analog volume circuit further as gain is lower.

9 Claims, 11 Drawing Sheets

AUDIO CIRCUIT

CROSS REFERENCE TO RELATED APPLICATION

The present application claims priority under 35 U.S.C. § 119 to Japanese Application No. 2017-213088, filed Nov. 2, 2017, the entire content of which is incorporated herein by reference.

BACKGROUND OF THE INVENTION

1. Field of the Invention

The present invention relates to an audio circuit.

2. Description of the Related Art

An electronic device functioning to reproduce an audio signal such as a compact disk (CD) player, an audio amplifier, a car stereo, a portable radio, and a portable audio player includes a sound processor performing various kinds of signal processing to the audio signal. FIG. 1 is a block diagram illustrating a configuration of a general audio system.

An audio system 100 includes a sound source 102, an analog amplifier 104, an analog/digital (A/D) converter 106, a digital signal processor (DSP) 108, a digital/analog (D/A) converter 210, a volume circuit 220, a power amplifier 110, and an electroacoustic transducer 112.

The sound source 102 is a CD player, a silicon audio player, a smartphone, or the like and outputs an analog audio signal. The analog amplifier 104 amplifies the analog audio signal output from the sound source 102 to match the signal with an input range of the downstream A/D converter 106. The DSP 108 receives a digital audio signal from the A/D converter 106 and performs predetermined digital signal processing to the signal. Examples of the signal processing performed by the DSP 108 are equalizing, bass boost, treble boost, stereo-monaural conversion, and digital volume control.

The D/A converter 210 converts the digital audio signal processed by the DSP 108 into an analog audio signal. The volume circuit 220 amplifies the output signal from the D/A converter 210 at gain corresponding to a volume value. The power amplifier 110 amplifies the output from the volume circuit 220 and drives a loudspeaker or a headphone serving as the electroacoustic transducer 112.

In this audio system 100, by providing the volume circuit 220 at the downstream of the D/A converter 210, noise characteristics at the time of volume attenuation can be improved.

FIG. 2A and FIG. 2B are circuit diagrams of functional integrated circuits (ICs) each including the D/A converter 210 and the volume circuit 220. The D/A converter 210 has a non-zero offset error. When this offset error is amplified at the volume circuit 220 or the downstream amplifier and is input into the electroacoustic transducer 112, a DC shock sound at the time of volume change is generated.

In the configuration in FIG. 2A, by providing a DC block capacitor between the D/A converter 210 and the volume circuit 220, the DC noise component can be eliminated. However, a low-frequency component close to the DC level cannot be eliminated.

In the configuration in FIG. 2B, a soft switch circuit 222 is provided in the volume circuit 220. The soft switch circuit 222 gently changes the volume (gain) at certain time constant.

FIG. 3A and FIG. 3B are waveform charts describing gain transition in the volume circuit 220 in FIG. 2B. For simplification, an output of the D/A converter 210 (an input $S_{IN}$ of the volume circuit 220) shall have constant amplitude and single frequency. FIG. 3A will be referred to. In a first stage, certain gain $g_1$ is set, and an envelope curve (amplitude) of an output signal $S_{OUT}$ of the volume circuit 220 conforms to the gain $g_1$.

At time $t_1$, an instruction on changing the gain $g_1$ to gain $g_2$, which is one step lower than the gain $g_1$, is generated. The volume circuit 220 gradually changes the gain $g_1$ to the gain $g_2$ in a predetermined transition time (time constant) $\tau_0$.

At time $t_2$, an instruction on changing the gain $g_2$ to gain $g_3$, which is one more step lower than the gain $g_2$, is generated. The volume circuit 220 gradually changes the gain $g_2$ to the gain $g_3$ in the equal transition time $\tau_0$.

FIG. 3B is a waveform chart describing an operation when gain changes by plural steps. In a first stage, certain gain $g_1$ is set. At time $t_3$, an instruction on changing the gain $g_1$ to gain $g_n$, which is plural steps lower than the gain $g_1$, is generated. The volume circuit 220 changes the gain $g_1$ to the gain $g_n$ step by step. The transition time $\tau_0$ required for a gain change at each step is equal. The transition is completed at time $t_4$, which is time when $\tau_0 \times (n-1)$ has passed since time $t_3$.

As illustrated in FIG. 3B, in the volume transition in the conventional volume circuit 220, gain is changed by one step (for example, 1 dB) at the fixed time constant $\tau_0$ that does not depend on the gain. Accordingly, in a case in which gain is changed from maximum gain (0 dB) to minimum gain (−80 dB), as long a transition time as $\tau_0 \times 80$ is required.

Using the conventional volume circuit 220 to switch an input source is considered. In a case in which a first source is switched to a second source, a sequence of (i) decreasing gain to a minimum value, (ii) switching the first source to the second source, and (iii) returning the gain to the original value is generated. In switching the input source, a mute period until the next source is reproduced is extended, and a user may have a feeling of strangeness.

SUMMARY OF THE INVENTION

The present invention is accomplished by taking such problems as mentioned above into consideration thereof, and an illustrative object of an aspect of the present invention is to provide an audio circuit shortening a switching period while restricting a noise.

An aspect of the present invention relates to an audio circuit. The audio circuit includes a digital/analog (D/A) converter structured to covert a digital audio signal into an analog audio signal, an analog volume circuit structured to receive an output of the D/A converter, and a controller structured to control gain of the analog volume circuit. The controller shortens transition time at each step in the analog volume circuit further as the gain is lower.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

Each of FIG. 5A

DETAILED DESCRIPTION OF THE INVENTION

Overview of Embodiment

Figure 1:
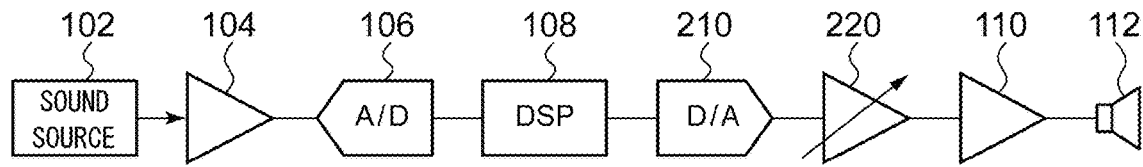
FIG. 1 is a block diagram illustrating a configuration of a general audio system.
Figure 2A:
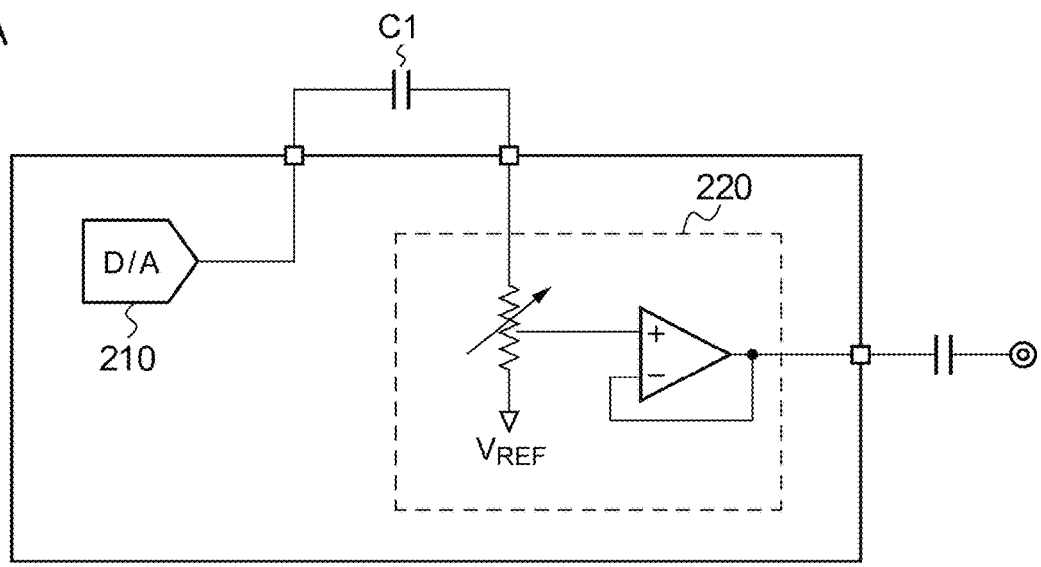
FIG. 2A and FIG. 2B are circuit diagrams of functional integrated circuits (ICs) each including a D/A converter and a volume circuit.
Figure 2B:
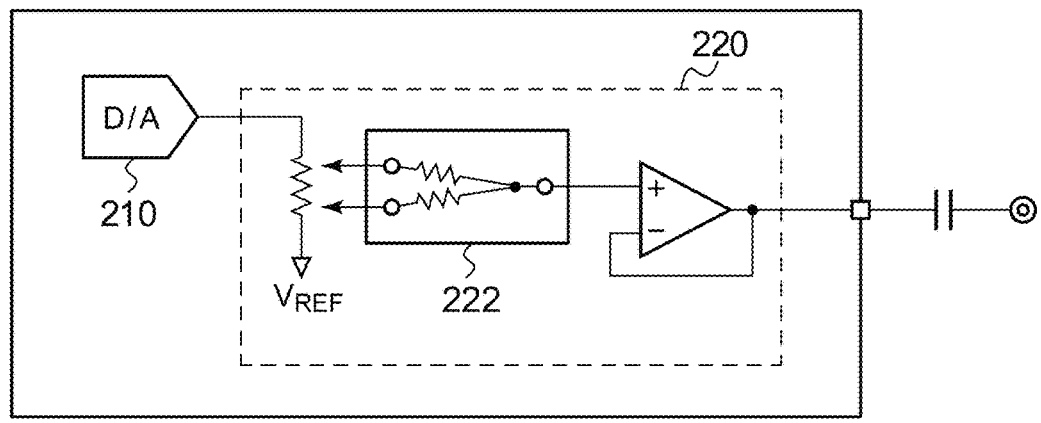
Figure 3A:
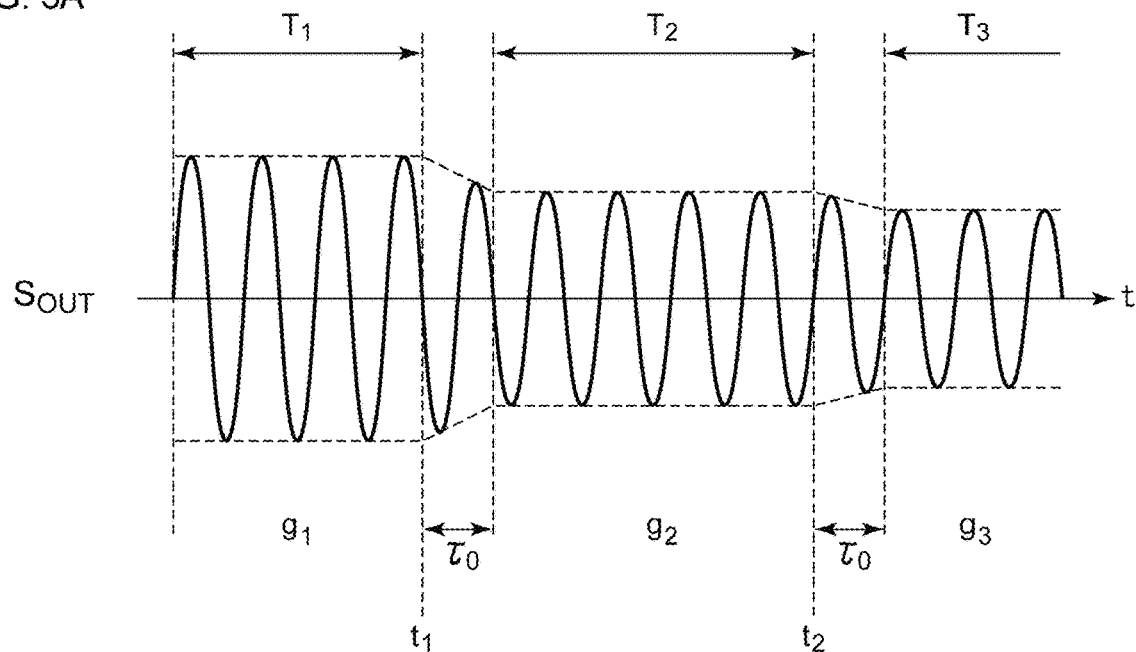
FIG. 3A and FIG. 3B are waveform charts describing gain transition in the volume circuit in FIG. 2B.
Figure 3B:
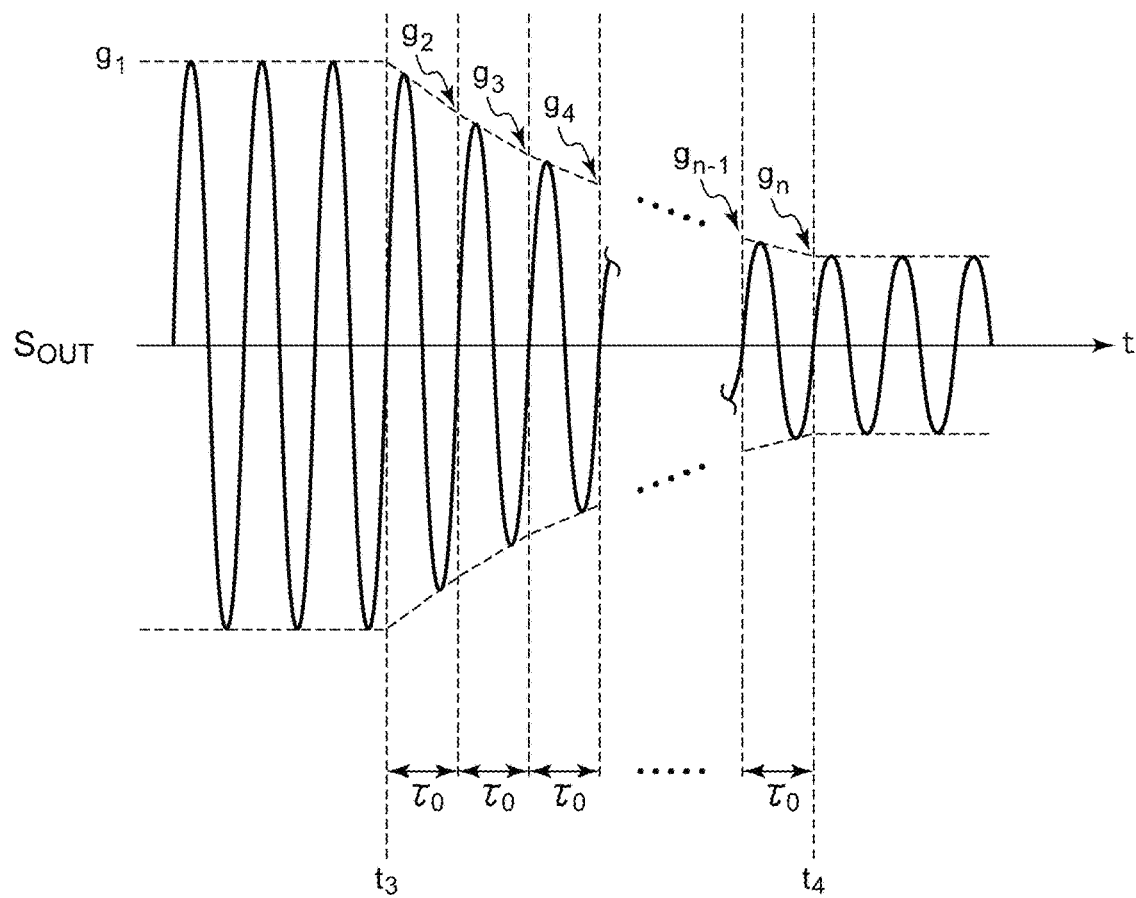

An embodiment disclosed in the present description relates to an audio circuit. The audio circuit includes a D/A converter converting a digital audio signal into an analog audio signal, an analog volume circuit receiving an output of the D/A converter, and a controller controlling gain of the analog volume circuit. The controller shortens transition time at each step in the analog volume circuit further as the gain is lower.

As the gain of the analog volume circuit is lower, the amplitude of a component resulting from an offset error of the D/A converter in a signal input into an electroacoustic transducer is smaller. That is, when the gain of the analog volume circuit is lower, a DC noise is less audible even in a case in which the transition time is shortened. Hence, with the embodiment, a switching period of volume can be shortened while restricting a noise.

The controller may include a table showing a relationship between the gain or a range of the gain and the transition time corresponding to the gain or the range of the gain.

The controller may include the plurality of tables, and the tables may be selectable for use. The DC noise is influenced not only by the gain of the analog volume circuit but also by gain of a downstream amplifier (power amplifier). In a case in which the gain of the power amplifier is high, the transition time is required to be extended. By preparing the plurality of tables, the audio circuit can be used in common by a plurality of platforms including amplifiers connected at the downstream of the audio circuit and having different gain ranges.

The controller may be implemented in a digital signal processor (DSP) structured to process the digital audio signal. By implementing the controller as a logic circuit, a circuit area of the audio circuit can be reduced.

The audio circuit may be integrated on one semiconductor substrate. The term "integrated" means a case in which all of components of the circuit are formed on the semiconductor substrate and a case in which main components of the circuit are integrated. Some resistors, capacitors, and the like may be provided outside the semiconductor substrate for control of circuit constant.

Embodiment

The invention will now be described based on preferred embodiments which do not intend to limit the scope of the present invention but exemplify the invention. All of the features and the combinations thereof described in the embodiment are not necessarily essential to the invention.

In the present description, "a state in which a member A is connected to a member B" includes a case in which the member A and the member B are connected physically directly and a case in which the member A and the member B are connected indirectly via another member which has no substantial effect on the electric connection state between the members or which does not impair a function and an effect obtained by the connection between the members.

Similarly, "a state in which a member C is provided between a member A and a member B" includes a case in which the member A and the member C, or the member B and the member C, are connected directly and a case in which the member A and the member C, or the member B and the member C, are connected indirectly via another member which has no substantial effect on the electric connection state between the members or which does not impair a function and an effect obtained by the connection between the members.

Figure 4:
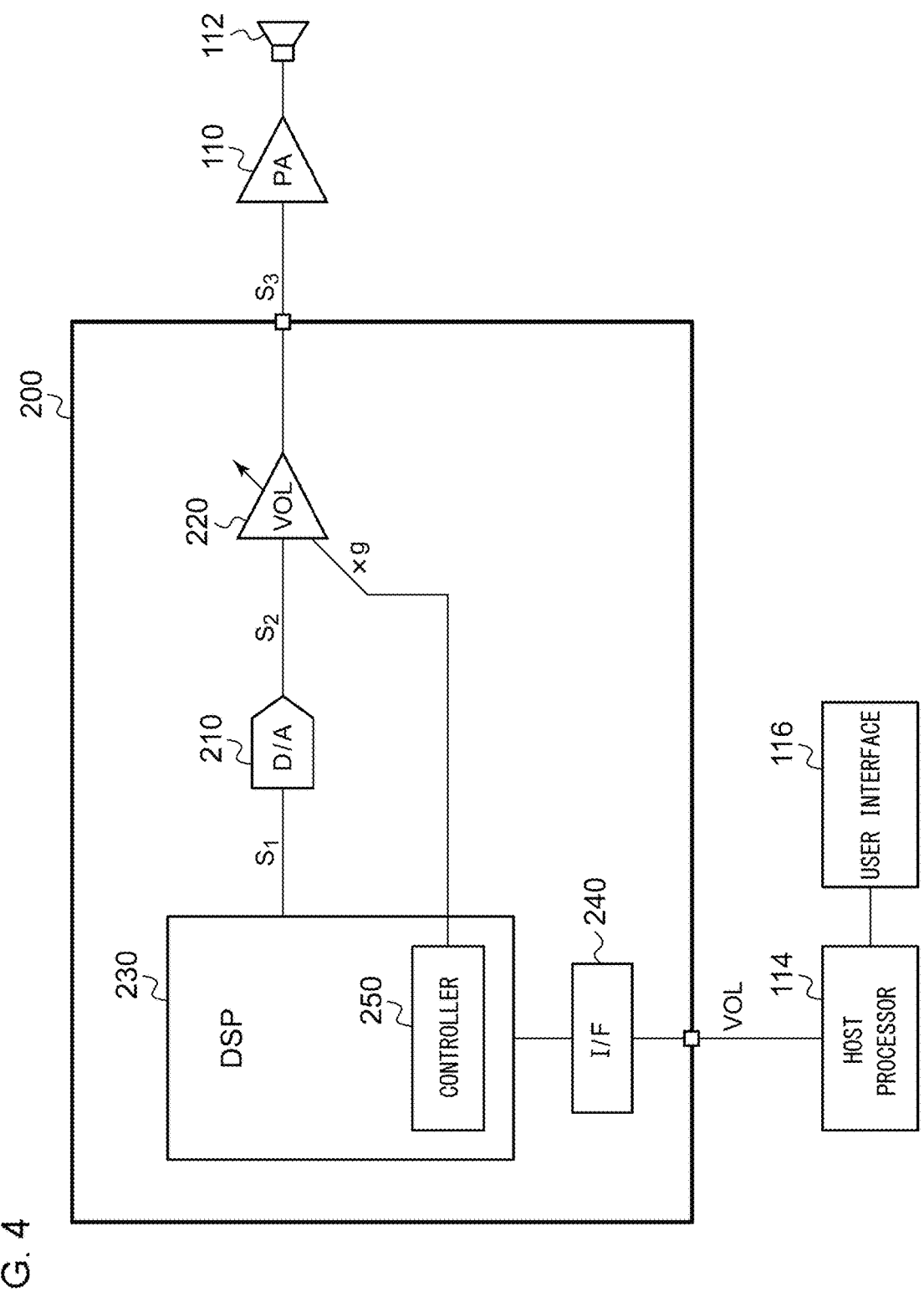
FIG. 4 is a block diagram of an audio system including an audio circuit according to an embodiment.

FIG. 4 is a block diagram of an audio system 100 including an audio circuit 200 according to an embodiment. In FIG. 4, each block is shown as a single-ended circuit. However, each block may be a differential circuit. The audio circuit 200 is a functional IC in which components are integrated on a semiconductor substrate.

The audio system 100 includes a power amplifier 110, an electroacoustic transducer 112, a host processor 114, and a user interface 116 as well as the audio circuit 200. The user interface 116 is a volume knob, a button, a touch panel, a remote controller, or the like and acquires a volume value specified by a user. The host processor 114 transmits a volume value VOL acquired by the user interface 116 to the audio circuit 200. The power amplifier 110 drives the electroacoustic transducer 112 based on an output signal $S_3$ of the audio circuit 200. The power amplifier 110 may be a class-D amplifier (digital amplifier) or an analog amplifier.

The audio circuit 200 includes a D/A converter 210, an analog volume circuit (also referred to simply as a volume circuit) 220, a DSP 230, and an interface circuit 240.

The interface circuit 240 is an inter IC ($I^2C$) interface, a serial peripheral interface (SPI), or the like and receives various setting values such as the aforementioned volume value VOL from the host processor 114.

A digital audio signal is input into the DSP 230 from a not-illustrated sound source. The DSP 230 performs various kinds of signal processing to the digital audio signal. The signal processing is not limited, and examples thereof are equalizing, tone control, bass boost, treble boost, loudness processing, stereo-monaural conversion, and digital volume control.

The D/A converter 210 converts a digital audio signal $S_1$ processed by the DSP 230 into an analog audio signal $S_2$.

The D/A converter 210 has an offset error. The offset error typically falls within a range from several mV to several tens of mV.

The volume circuit 220 includes a variable gain amplifier and amplifies the audio signal $S_2$ from the D/A converter 210 at gain g corresponding to the volume value VOL set by the user. Meanwhile, amplification here includes attenuation having gain lower than 1. The volume circuit 220 also has a function of gradually changing gain. The volume circuit 220 having such a function may use a known technique, and a configuration thereof is not particularly limited.

A controller 250 controls the analog volume circuit 220. Specifically, when the volume value VOL changes, the controller 250 changes gain of the volume circuit 220 into a value corresponding to the volume value. The controller 250 is a part of the DSP 230 and is implemented as a digital circuit.

The controller 250 shortens transition time at each step in the analog volume circuit 220 further as gain is lower. Although each step typically has 1 dB, the present invention is not limited to this, and a 0.5-dB step, a 2-dB step, or a 3-dB step may be available.

Figure 5:
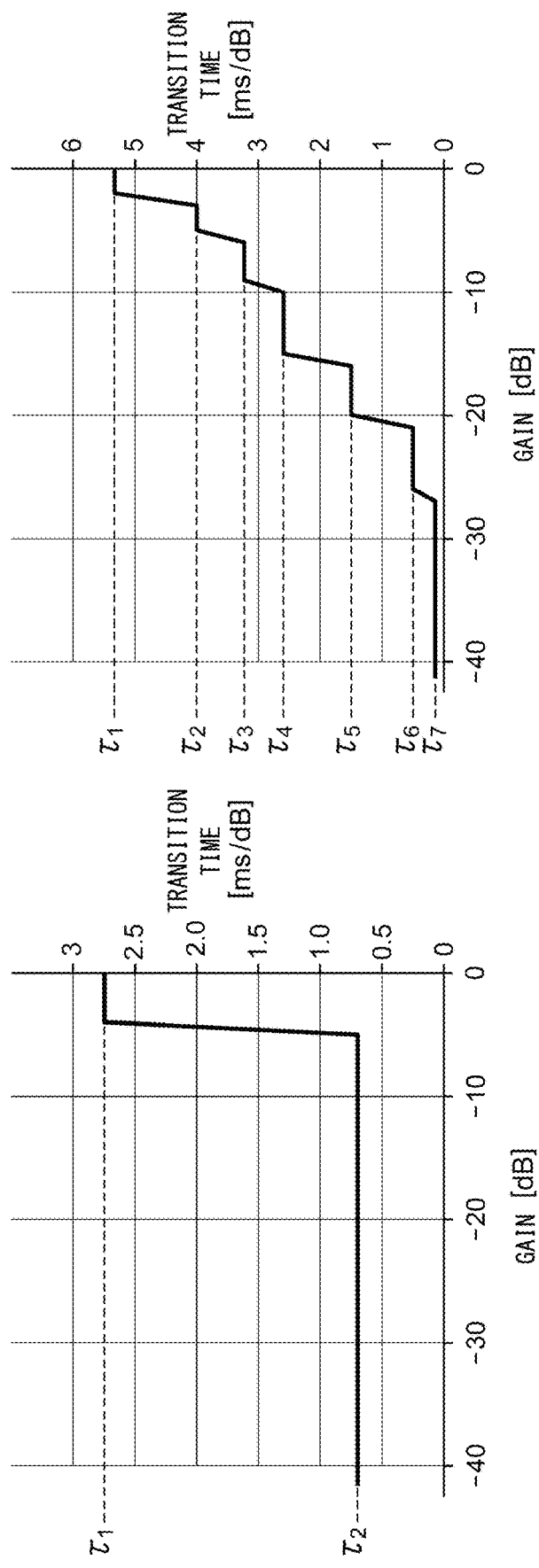
FIG. 5B illustrates a relationship between gain and transition time.

Each of FIG. 5A and FIG. 5B illustrates a relationship between gain and transition time. The gain on the horizontal axis represents gain immediately before transition. In FIG. 5A, the transition time switches between two values. In a case in which the gain (volume value VOL) is in a range from 0 to −4 dB, the transition time is a first value $\tau_1$, which is relatively long. In a case in which the gain is lower than −5 dB, the transition time is a second value $\tau_2$, which is relatively short. In FIG. 5B, the transition time switches among seven values in accordance with the range of the gain. The number of times of switching the transition time is not particularly limited as long as the number is two or more.

Figure 6:
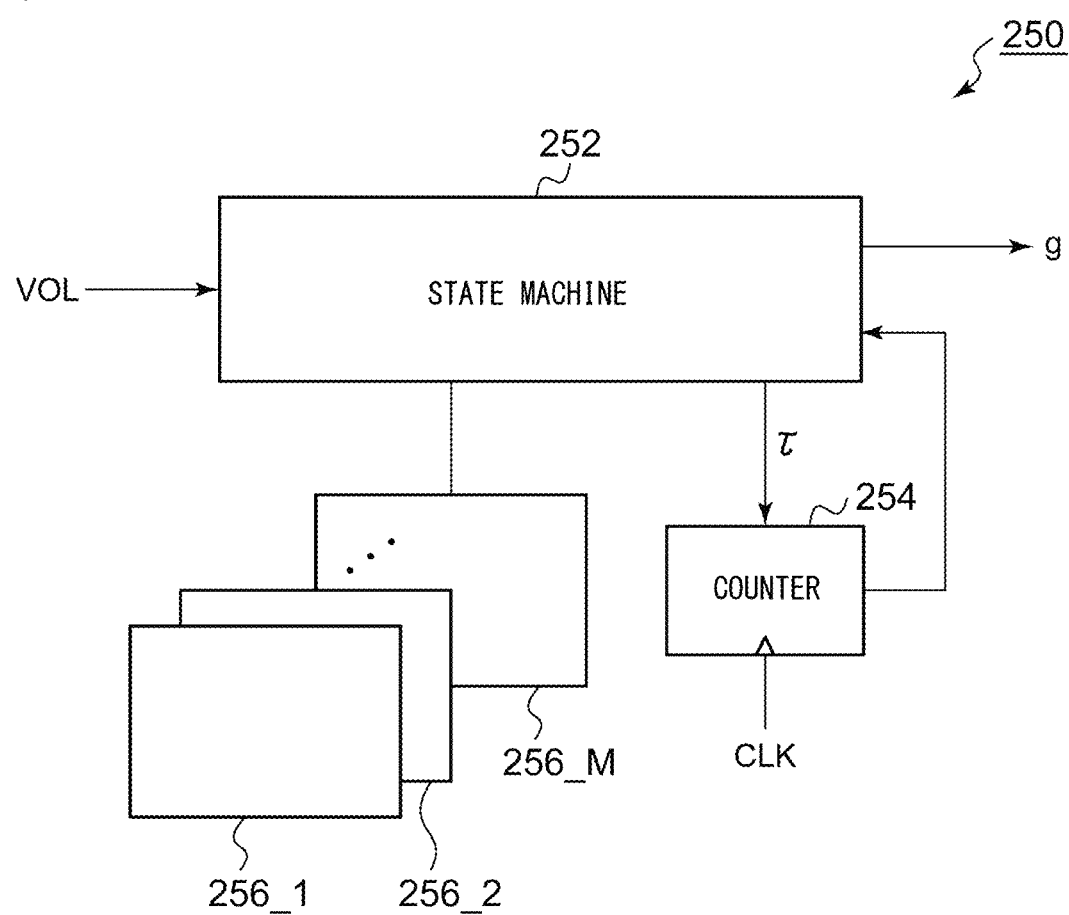
FIG. 6 is a block diagram illustrating a configuration example of a controller.

FIG. 6 is a block diagram illustrating a configuration example of the controller 250. The controller 250 includes a state machine 252, a counter 254, and a table 256. The state machine 252 receives a volume value VOL after change specified by the user. The state machine 252 changes gain step by step (for example, 1 dB each) from gain g_START corresponding to a volume value VOL before change to gain g_END corresponding to a volume value VOL after change. The relationship between the transition time τ per step and the gain g is stored in the table 256, and the state machine 252 reads transition time $\tau_i$ corresponding to current gain $g_i$ from the table 256. The state machine 252 measures the transition time $\tau_i$ with use of the counter 254 and gently changes the gain of the volume circuit 220 from the current gain $g_i$ to gain $g_{i+1}$, which is at the next step, in the transition time $\tau_i$. When the transition is completed, current gain is $g_{i+1}$. The state machine 252 repeats this operation and changes the gain down to the end value g_END.

The controller 250 preferably includes a plurality of tables 256_1 to 256_M (M≥2). The plurality of tables 256_1 to 256_M store different relationships (control characteristics) between the gain and the transition time. Preferably, which table is to be referred to can be set from the outside with use of a register or the like.

Figure 7:
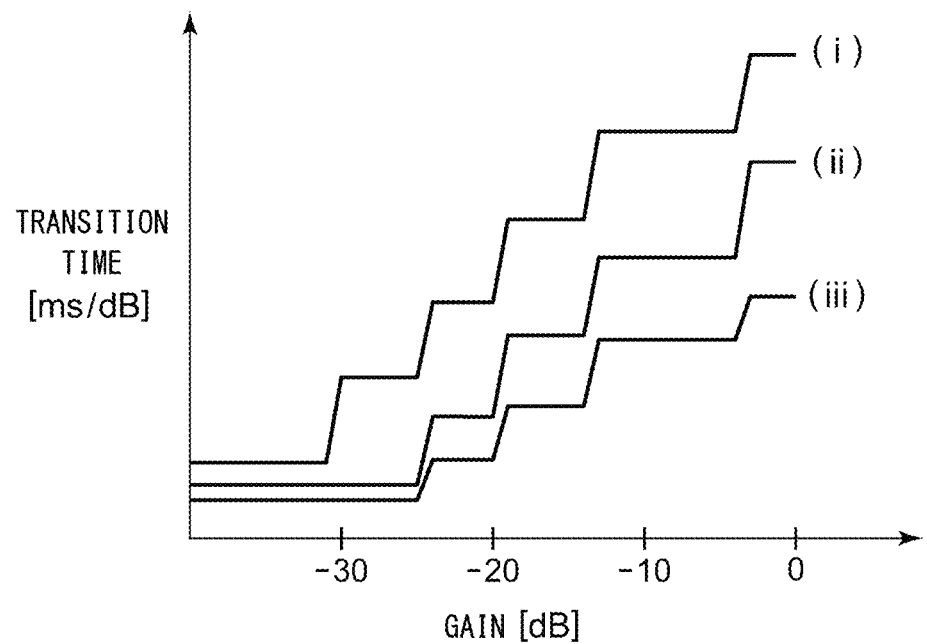
FIG. 7 illustrates a plurality of different control characteristics.

FIG. 7 illustrates a plurality of different control characteristics. FIG. 7 illustrates control characteristics (i) to (iii) when M=3. In the example in FIG. 7, although the change points of the transition time correspond to the same gain value, the present invention is not limited to this, and the change points of the transition time may exist at different gain values. Also, the number of times of switching the transition time may differ.

The configuration of the audio system 100 has been described above. Next, an operation thereof will be described.

Figure 8A:
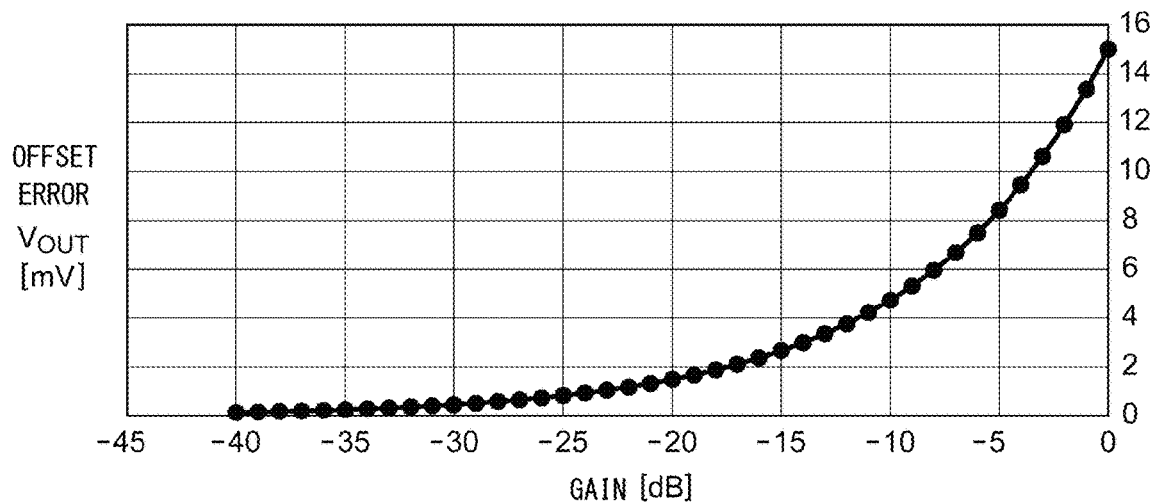
FIG. 8A and FIG. 8B illustrate an influence of an offset error of a D/A converter.
Figure 8B:
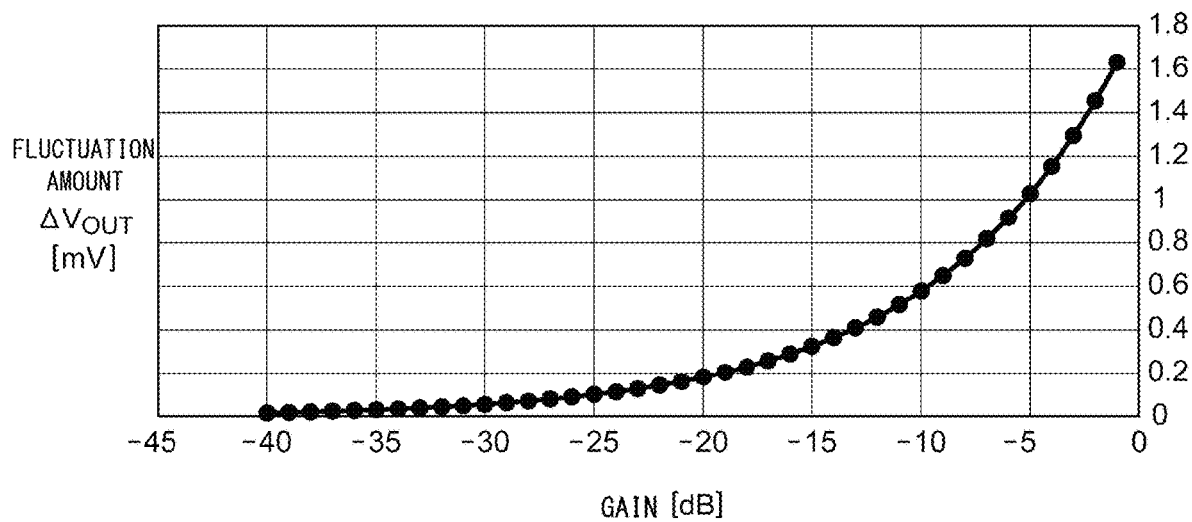

FIG. 8A and FIG. 8B illustrate an influence of an offset error of the D/A converter 210. FIG. 8A illustrates voltage $V_{OUT}$ resulting from the offset error of the D/A converter at the input terminal of the electroacoustic transducer 112, and FIG. 8B illustrates a fluctuation amount $\Delta V_{OUT}$ of the voltage $V_{OUT}$ at the input terminal of the electroacoustic transducer 112 when the gain of the volume circuit 220 is changed step by step. It is to be noted that, in this case, the offset error of the D/A converter 210 is 15 mV, and the gain of the power amplifier 110 is 0 dB. When the gain of the volume circuit 220 is a maximum value (0 dB), the influence $V_{OUT}$ of the offset error at the input terminal of the electroacoustic transducer 112 is 15 mV, which is maximum.

As illustrated in FIG. 8A, as the gain is lower, the influence $V_{OUT}$ of the offset error is lower, and the fluctuation amount $\Delta V_{OUT}$ of the voltage $V_{OUT}$ when the gain is changed step by step is also lower. This means that, when the gain is lower, a DC noise is less audible even in a case in which the gain is changed in a short period.

Figure 9A:
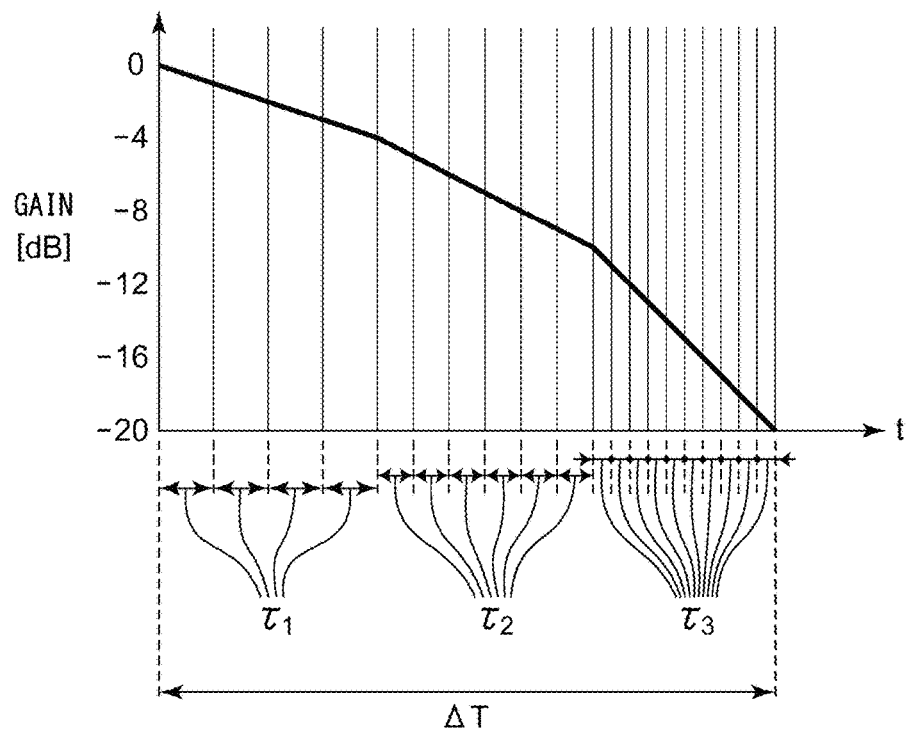
FIG. 9A illustrates gain control in the audio system according to the embodiment.
Figure 9B:
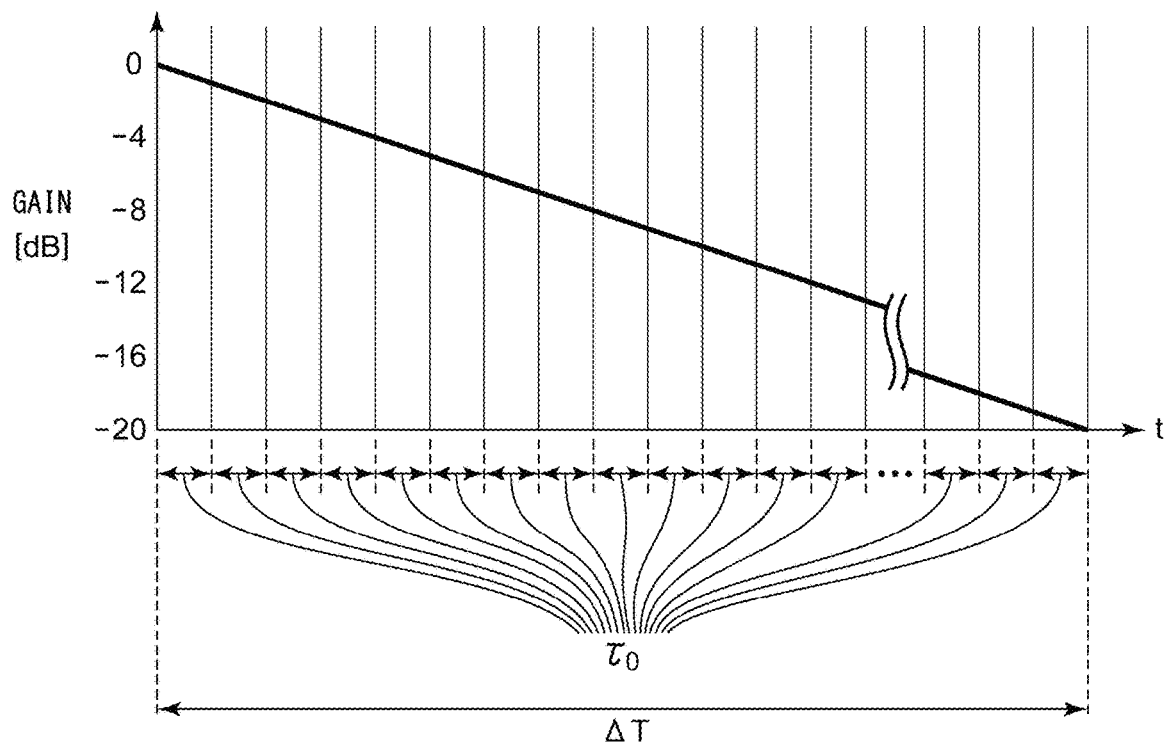
FIG. 9B illustrates conventional gain control.

FIG. 9A illustrates gain control in the audio system 100 according to the embodiment, and FIG. 9B illustrates conventional gain control. The horizontal axis represents time while the vertical axis represents gain. Each of FIG. 9A and FIG. 9B illustrates an operation of decreasing the gain from 0 dB to −20 dB.

First, referring to FIG. 9B, the conventional gain control will be described. In the conventional control, transition time $\tau_0$ at each step is fixed without depending on the value of the gain. The fixed transition time $\tau_0$ is set so that the DC noise may not be audible from the electroacoustic transducer 112 when the gain is 0 dB. As the number of steps for the gain change increases, the total transition time is extended in proportion to the number of steps. In this example, $20 \times \tau_0$ is the total transition time ΔT.

Next, referring to FIG. 9A, the gain control according to the embodiment will be described. In the example in FIG. 9A, the transition time at each step in a range from 0 to −4 dB is $\tau_1$, the transition time in a range from −4 to −10 dB is $\tau_2$, the transition time in a range from −10 to −20 dB is $\tau_3$, and a relationship of $\tau_1 > \tau_2 > \tau_3$ is established. The values $\tau_1$, $\tau_2$, and $\tau_3$ are determined so that the DC noise is not audible from the electroacoustic transducer 112 in the corresponding gain ranges. Since a relationship of $\tau_0 \geq \tau_1 > \tau_2 > \tau_3$ is established, the total transition time ΔT can be shorter than that in the conventional case.

The operation of the audio system 100 has been described above. According to this audio system 100, the total transition time can drastically be shortened while restricting the noise.

In FIG. 9A and FIG. 9B, examples of changing the gain from 0 dB have been described. However, actually, it is rare to use the audio circuit at 0 dB. In actual use, the audio circuit is used in a range of lower gain values, and the effect of shortening the total transition time is thus larger.

Also, the plurality of control characteristics are prepared and selectable. Accordingly, the audio circuit 200 can be used in common by a plurality of platforms including amplifiers connected at the downstream of the audio circuit 200 and having different gain ranges.

The present invention has been described above based on the embodiment. It is to be understood by those skilled in the art that the present embodiment is illustrative only, that combinations of the respective components and the respective processes can be modified, and that such modification examples fall within the scope of the present invention. Such modification examples will be described below.

Modification Example 1

In the embodiment, although the volume circuit 220 that can control the gain by means of the 1-dB step has been described, the present invention is not limited to this, and the gain steps may be at irregular intervals. In this case, as the gain is lower, the transition time per dB may be set to be shorter.

Modification Example 2

Figure 10:
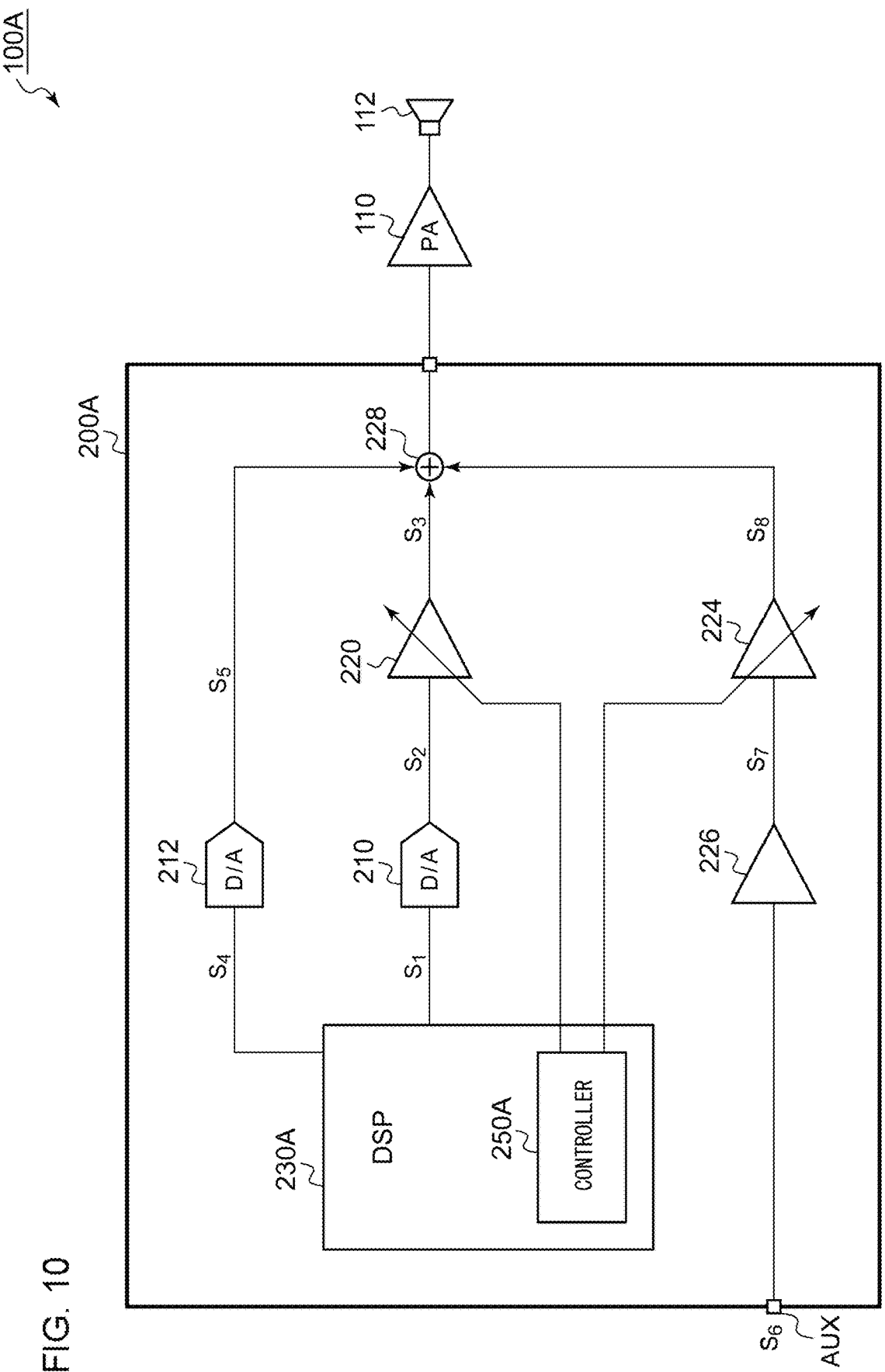
FIG. 10 is a block diagram of an audio circuit according to a modification example.

FIG. 10 is a block diagram of an audio circuit 200A according to a modification example. The audio circuit 200A includes a D/A converter 212, a volume circuit 224, an isolation amplifier 226, and a synthesis circuit 228, in addition to the audio circuit 200 in FIG. 4.

A DSP 230A outputs a predetermined digital audio signal $S_4$ such as a beep sound. The D/A converter 212 converts the digital audio signal $S_4$ into an analog audio signal $S_5$.

An analog audio signal $S_6$ is input into an external input (AUX) pin of the audio circuit 200A. The analog audio signal $S_6$ is buffered (amplified) by the isolation amplifier 226 for ground noise elimination. The volume circuit 224 is configured similarly to the volume circuit 220 and amplifies an output signal $S_7$ of the isolation amplifier 226. A controller 250A controls gain of the volume circuit 224 in accordance with a setting value for volume. The controller 250A controls the gain of the volume circuit 224 in a similar manner to that of the volume circuit 220 described above. The synthesis circuit 228 adds the plurality of analog audio signals $S_3$, $S_5$, and $S_8$.

In this audio circuit 200A, the isolation amplifier 226 also has a DC offset error in a similar manner to the D/A converter 210. According to the present modification example, a noise resulting from the DC offset error of the isolation amplifier 226 can be restricted, and the transition time can be shortened. Meanwhile, a control characteristic (a relationship between the gain and the transition time) of the volume circuit 224 may be specified in consideration of the DC offset error of the isolation amplifier 226, and the control characteristic of the volume circuit 224 and the control characteristic of the volume circuit 220 may differ.

APPLICATION

Figure 11:
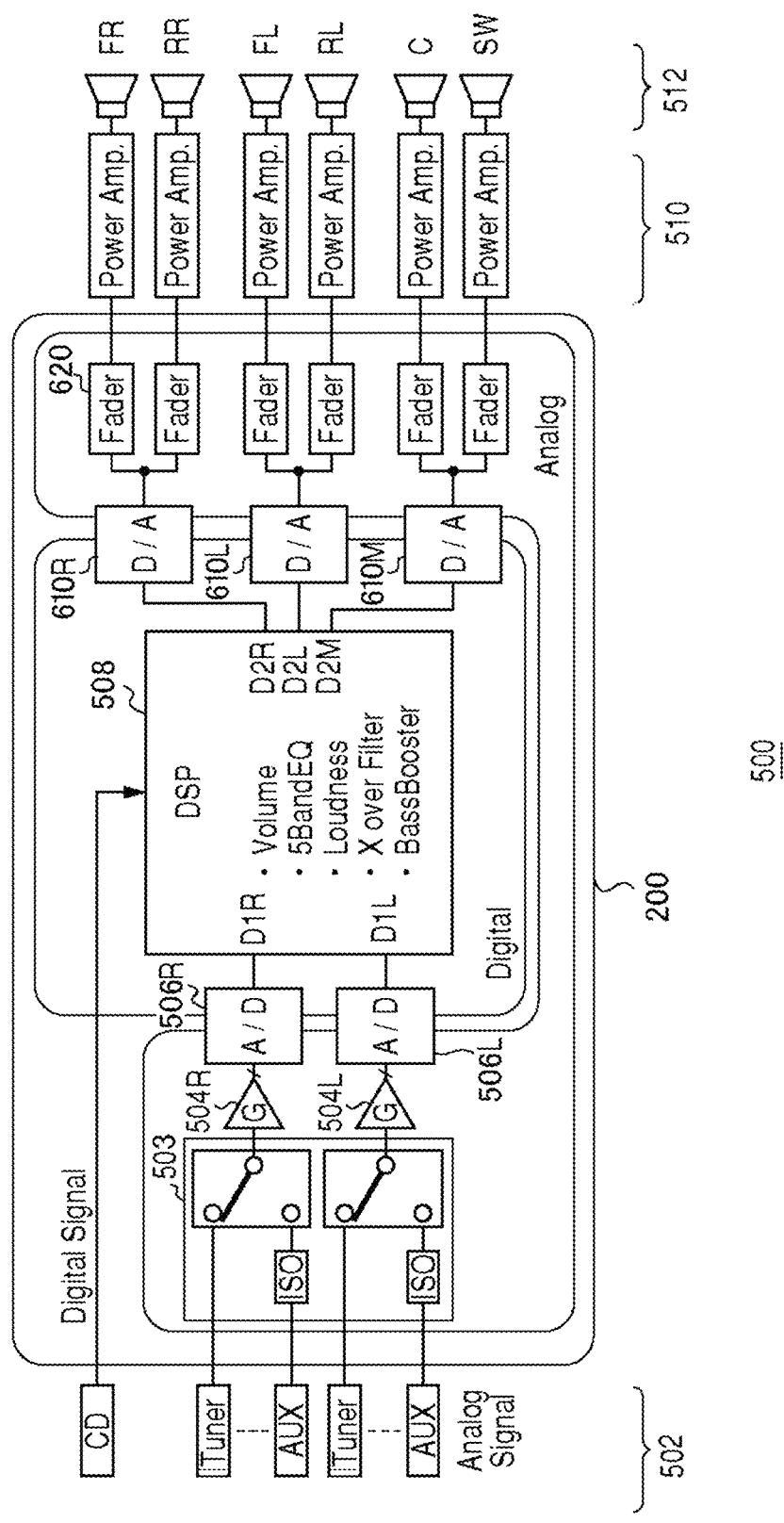
FIG. 11 is a block diagram illustrating a configuration of an in-vehicle audio device using the audio circuit.

Lastly, application of the audio circuit 200 will be described. FIG. 11 is a block diagram illustrating a configuration of an in-vehicle audio device 500 using the audio circuit 200. The in-vehicle audio device 500 has a 5.1-channel (front right FR, rear right RR, front left FL, rear left RL, center C, and subwoofer SW) configuration.

The audio circuit 200 receives a digital input from a sound source 502 such as a CD player. The digital input from the CD player is directly input into a DSP 508. A stereo analog audio signal from a tuner is input into a TUNER channel, and a stereo analog audio signal from a mobile audio player or the like is input into an AUX channel.

An input selector 503 selects an input channel, and an amplifier 504 converts a single-ended analog audio signal of a selected channel into a differential signal. In a case in which a differential audio signal is input into the selected channel, the differential signal conversion processing is skipped.

An A/D converter 506R converts an R-channel differential input audio signal into a digital audio signal, and an A/D converter 506L converts an L-channel differential input audio signal into a digital audio signal.

The DSP 508 includes a digital volume circuit, a 5-band equalizer, a loudness circuit, a crossover filter, and a bass boost circuit and performs predetermined signal processing to digital audio signals D1R and D1L.

A D/A converter 610R converts an R-channel digital audio signal D2R into a differential analog audio signal. A D/A converter 610L converts an L-channel digital audio signal D2L into a differential analog audio signal. A D/A converter 610M converts a digital audio signal D2M of a remaining channel into a differential analog audio signal. The D/A converter 610 corresponds to the D/A converter 210 in FIG. 4. A fader volume 620 corresponds to the volume circuit 220 in FIG. 4.

The audio circuit 200 in FIG. 11 can be used not only in the in-vehicle audio device but also in an audio component device of a household home audio system. Alternatively, the audio circuit 200 can be implemented in an electronic device such as a television, a desktop personal computer (PC), a laptop computer, a tablet PC, a cellphone terminal, a digital camera, and a portable audio player.

Figure 12A:
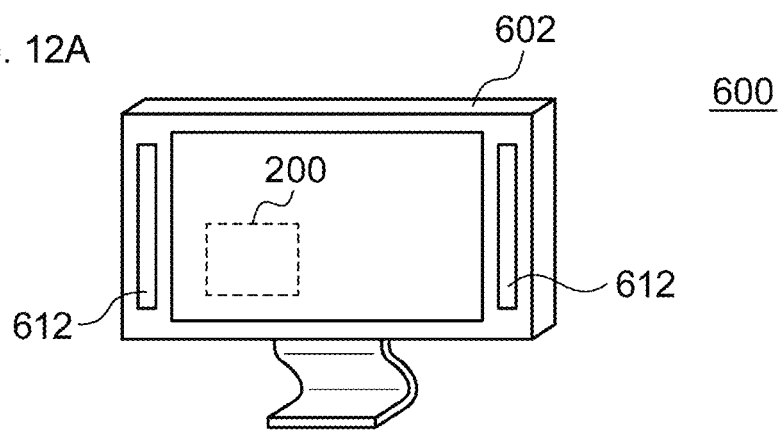
FIG. 12A to FIG. 12C are external views of electronic devices and audio component devices.
Figure 12B:
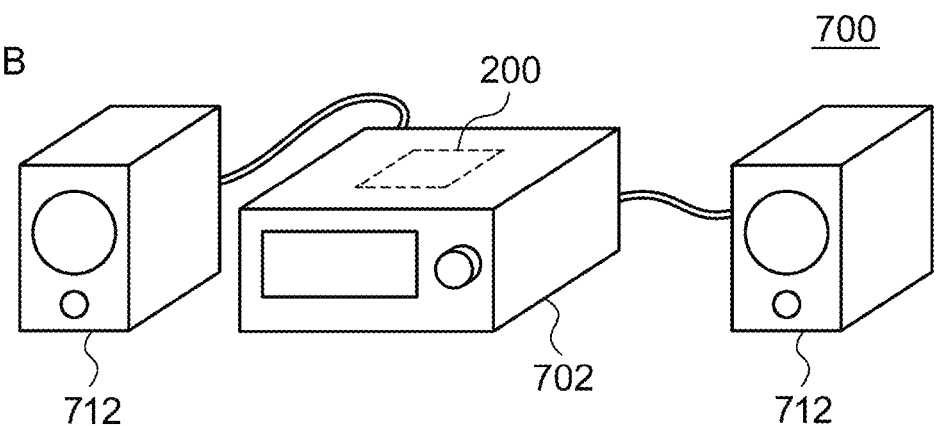
Figure 12C:
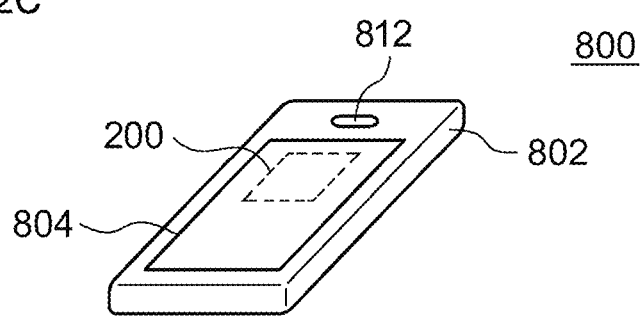

FIG. 12A to FIG. 12C are external views of electronic devices and audio component devices. FIG. 12A illustrates a display device 600, which is an example of the electronic device. The display device 600 includes a chassis 602 and a loudspeaker 612. The audio circuit 200 is incorporated into the chassis 602 and drives the loudspeaker 612.

FIG. 12B illustrates an audio component system 700. The audio component system 700 includes a chassis 702 and a loudspeaker 712. The audio circuit 200 is incorporated into the chassis 702 and drives the loudspeaker 712.

FIG. 12C illustrates a small-sized information terminal 800, which is an example of the electronic device. Examples of the small-sized information terminal 800 are a smartphone, a tablet PC, and an audio player. The small-sized information terminal 800 includes a chassis 802, a loudspeaker 812, and a display 804. The audio circuit 200 is incorporated into the chassis 802 and drives the loudspeaker 812.

While the preferred embodiments of the present invention have been described using specific terms, such description is for illustrative purposes only, and it is to be understood that changes and variations may be made without departing from the spirit or scope of the appended claims.

What is claimed is:

1. An audio circuit comprising:
    a digital/analog (D/A) converter structured to covert a digital audio signal into an analog audio signal;
    an analog volume circuit coupled to receive an output of the D/A converter; and
    a controller structured to control gain of the analog volume circuit,
    wherein the controller is structured to shorten transition time at each step in the analog volume circuit further as the gain is lower and to change the gain of the analog volume circuit step by step toward a target value corresponding to a volume value after change; and
    the change amount of the gain for each step is constant.
2. The audio circuit according to claim 1, wherein the controller includes a table showing a relationship between the gain or a range of the gain and transition time corresponding to the gain or the range of the gain.

3. The audio circuit according to claim 2, wherein the controller includes the plurality of tables, and the tables are selectable for use.

4. The audio circuit according to claim 1, wherein the controller is implemented in a digital signal processor (DSP) structured to process the digital audio signal.

5. An audio circuit comprising:
- an isolation amplifier coupled to receive an analog audio signal;
- an analog volume circuit coupled to receive an output signal of the isolation amplifier; and
- a controller structured to control gain of the analog volume circuit,
- wherein the controller is structured to shorten transition time at each step in the analog volume circuit further as the gain is lower and to change the gain of the analog volume circuit step by step toward a target value corresponding to a volume value after change; and
- the change amount of the gain for each step is constant.

6. The audio circuit according to claim 1, wherein the audio circuit is integrated on one semiconductor substrate.

7. An in-vehicle audio device comprising:
the audio circuit according to claim 1.

8. An audio component device comprising:
the audio circuit according to claim 1.

9. An electronic device comprising:
the audio circuit according to claim 1.

* * * * *